(12) United States Patent
Farshbaf Zinati et al.

(10) Patent No.: US 10,770,086 B2
(45) Date of Patent: Sep. 8, 2020

(54) ZERO-LATENCY PULSE DENSITY MODULATION INTERFACE WITH FORMAT DETECTION

(71) Applicant: Cirrus Logic International Semiconductor Ltd., Edinburgh (GB)

(72) Inventors: Masoud Farshbaf Zinati, Austin, TX (US); Arun Ramani, Austin, TX (US); Amar Vellanki, Cedar Park, TX (US); Xiaofan Fei, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 160 days.

(21) Appl. No.: 16/170,524

(22) Filed: Oct. 25, 2018

(65) Prior Publication Data

US 2019/0259402 A1 Aug. 22, 2019

Related U.S. Application Data

(60) Provisional application No. 62/632,088, filed on Feb. 19, 2018.

(51) Int. Cl.
| | |
|---|---|
| *G10L 19/03* | (2013.01) |
| *G10L 19/032* | (2013.01) |
| *H03F 3/183* | (2006.01) |
| *H03F 3/217* | (2006.01) |
| *G10L 19/26* | (2013.01) |
| *G10L 19/008* | (2013.01) |

(52) U.S. Cl.
CPC .......... *G10L 19/032* (2013.01); *G10L 19/008* (2013.01); *G10L 19/26* (2013.01); *H03F 3/183* (2013.01); *H03F 3/217* (2013.01); *H03F 3/2171* (2013.01); *H03F 3/2175* (2013.01); *H03F 2200/03* (2013.01); *H03F 2200/171* (2013.01)

(58) Field of Classification Search
CPC ..... G10L 19/032; G10L 19/008; H03F 3/183; H03F 3/217; H03F 3/2171; H03F 3/2175; H03F 2200/03; H03F 2200/171
USPC .......................................... 375/364
See application file for complete search history.

(56) References Cited

U.S. PATENT DOCUMENTS

| | | | | |
|---|---|---|---|---|
| 5,682,162 A | * | 10/1997 | Hamasaki | H03G 3/341 341/144 |
| 2016/0044412 A1 | * | 2/2016 | Mackay | H04R 3/00 381/119 |

\* cited by examiner

*Primary Examiner* — Kevin M Burd
(74) *Attorney, Agent, or Firm* — Jackson Walker L.L.P.

(57) ABSTRACT

A method may include receiving a stream of serial pulse-density modulation (PDM) data representing a first channel of data synchronized with a rising edge of a clock associated with the serial PDM data and a second channel of data synchronized with a falling edge of the clock, wherein each of the first channel of data and the second channel of data include encoded datagrams wherein each encoded datagram comprises more than one digital bit, detecting an invalid state associated with the stream, and responsive to detecting the invalid state, determining boundaries of each encoded datagram of the stream based on where within the stream the invalid state occurred.

10 Claims, 5 Drawing Sheets

| CONFIGURATION | CLOCK RATE | PDM_CLK_PHASE | DATA CAPTURE | | AUTO DETECT |
| --- | --- | --- | --- | --- | --- |
| | | | MSB | LSB | |
| MONO 1-BIT | 1X | 180° | 1'b0 | D | OFF |
| StereoL 1-BIT | 1X | 180° | 1'b0 | D | OFF |
| StereoR 1-BIT | 1X | 0° | 1'b0 | D | OFF |
| MONO 1.5-BIT | 1X | 0° | DF | D | OFF |
| StereoL 1.5-BIT | 2X | 270° | DF | D | DEFAULT |
| | | 90° | DF | D | INVALID CODE IN PRIOR SELECTION |
| StereoR 1.5-BIT | 2X | 0° | DR | D | DEFAULT |
| | | 180° | DR | D | INVALID CODE IN PRIOR SELECTION |

ZERO-LATENCY PULSE DENSITY MODULATION INTERFACE WITH FORMAT DETECTION

REFERENCE TO PREVIOUSLY FILED APPLICATION

This application claims benefit of U.S. Provisional Application Ser. No. 62/632,088, filed on Feb. 19, 2018, which is incorporated by reference herein in its entirety.

FIELD OF DISCLOSURE

The present disclosure relates in general to circuits for audio devices, including without limitation personal audio devices such as wireless telephones and media players, and more specifically, to systems and methods for automatically detecting a format of a pulse density modulation signal with zero latency.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

Many audio systems encode audio signals into pulse density modulation (PDM) signals. As an example, some audio systems utilize "1.5-bit" encoding in which, for each audio channel, datagrams of two bits are used to encode three quantization levels, with one two-bit code being an invalid code. As another example, some audio systems use 2-bit encoding in which, for each audio channel, datagrams of two bits are used to encode four quantization levels. Oftentimes, two or more audio channels of a signal are encoded in a single PDM data stream, with alternating datagrams representing each channel in the data stream (e.g., a two-bit datagram representing a left audio channel, followed by a two-bit datagram representing a right audio channel, followed by a two-bit datagram representing the left audio channel, followed by a two-bit datagram representing the right audio channel, and so on).

In many audio systems, audio data in PDM format may be communicated via a single electrical conduit (e.g., package pin, trace, wire, cable, etc.). Because a transmitter (e.g., a processor) of a PDM signal may be powered on asynchronously with a receiver (e.g., a Class-D amplifier) of the PDM signal, detection methods are needed to determine the boundaries of PDM datagrams (e.g., determining where within the data stream a most-significant bit of a datagram is located) as well as determining which audio channel each PDM datagram is associated. In addition, it may be desirable to determine a sampling edge across all possible data formats (e.g., number of bits per datagram, mono audio, stereo audio) that leads to a deterministic and substantially zero delay.

SUMMARY

In accordance with the teachings of the present disclosure, one or more disadvantages and problems associated with existing approaches to processing of multi-bit PDM data may be reduced or eliminated.

In accordance with embodiments of the present disclosure, a method may include receiving a stream of serial pulse-density modulation (PDM) data representing a first channel of data synchronized with a rising edge of a clock associated with the serial PDM data and a second channel of data synchronized with a falling edge of the clock, wherein each of the first channel of data and the second channel of data include encoded datagrams wherein each encoded datagram comprises more than one digital bit, detecting an invalid state associated with the stream, and responsive to detecting the invalid state, determining boundaries of each encoded datagram of the stream based on where within the stream the invalid state occurred.

In accordance with these and other embodiments of the present disclosure, a system may include an input configured to receive a stream of serial pulse-density modulation (PDM) data representing a first channel of data synchronized with a rising edge of a clock associated with the serial PDM data and a second channel of data synchronized with a falling edge of the clock, wherein each of the first channel of data and the second channel of data include encoded datagrams wherein each encoded datagram comprises more than one digital bit. The system may also include a processing subsystem configured to detect an invalid state associated with the stream and responsive to detecting the invalid state, determine boundaries of each encoded datagram of the stream based on where within the stream the invalid state occurred.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
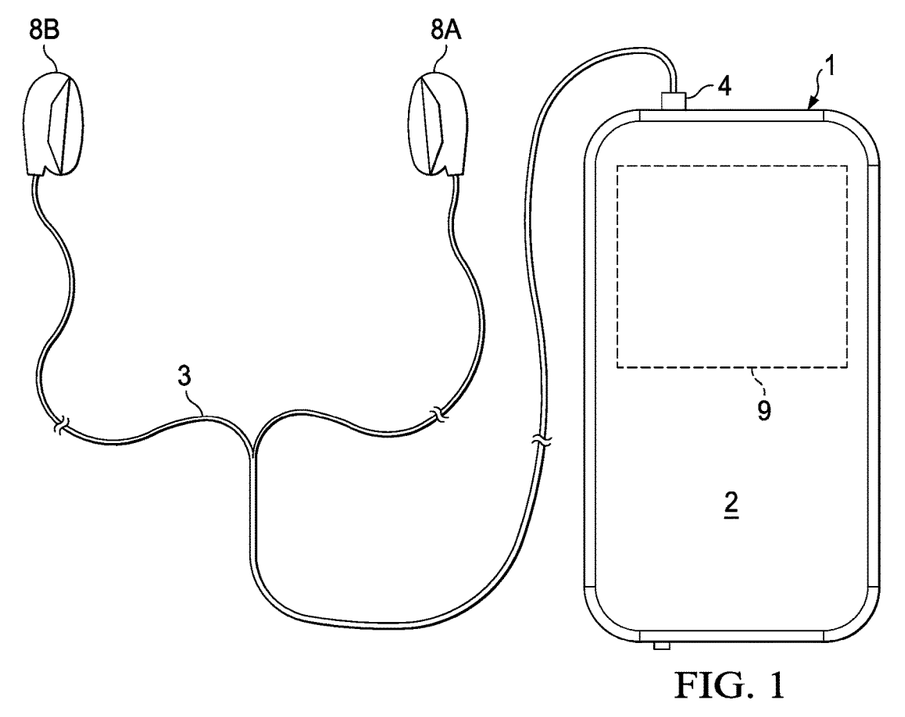
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
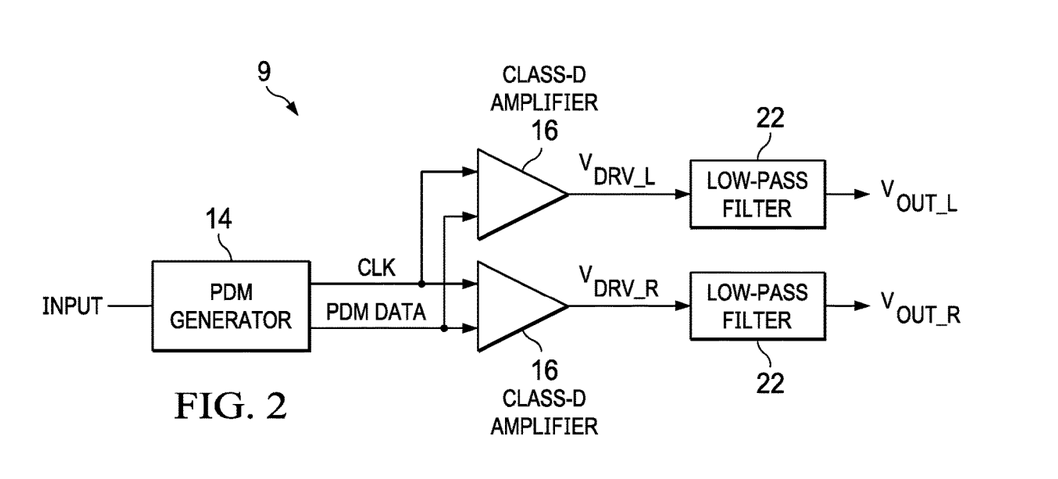
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, PDM generator 14 may generate a PDM input signal PDMDATA, a pulse-width modulated signal based on an input signal INPUT. PDM generator 14 may also generate a clock signal CLK indicating the synchronization of data communicated within PDM input signal PDMDATA.

One or more Class-D amplifiers 16 may receive PDM input signal PDMDATA and clock signal CLK and output a modulated output signal that may be filtered by a low-pass filter 22 to generate an analog output signal which may be driven to a transducer (e.g., one or more of speakers 8A and 8B) for playback of audio sound. For example, in a stereo audio system, PDM input signal PDMDATA may have encoded therein datagrams for audio to be played back to two different audio output channels. Thus, in such a stereo audio system, a first Class-D amplifier 16 may receive PDM input signal PDMDATA and clock signal CLK and process only data associated with its audio channel in order to output a modulated output signal $V_{DRV\_L}$ that may be filtered by a low-pass filter 22 to generate an analog output signal $V_{OUT\_L}$ which may be driven to a transducer (e.g., speaker 8A) for playback of audio sound, and a second Class-D amplifier 16 may receive PDM input signal PDMDATA and clock signal CLK and process only data associated with its audio channel in order to output a modulated output signal $V_{DRV\_R}$ that may be filtered by a low-pass filter 22 to generate an analog output signal $V_{OUT\_R}$ which may be driven to a transducer (e.g., speaker 8b) for playback of audio sound.

Although FIG. 2 and the foregoing paragraph contemplate, for the purposes of clarity and exposition, audio IC 9 as being a two-channel stereo audio system, audio IC 9 and the systems and methods described herein do not apply to only a two-channel stereo audio system, but may generally be applied to a single-channel (e.g., mono) system, dual-channel (e.g., stereo) system, or multi-channel (e.g., 5.1 surround sound, 7.1 surround sound) system.

Figure 3:
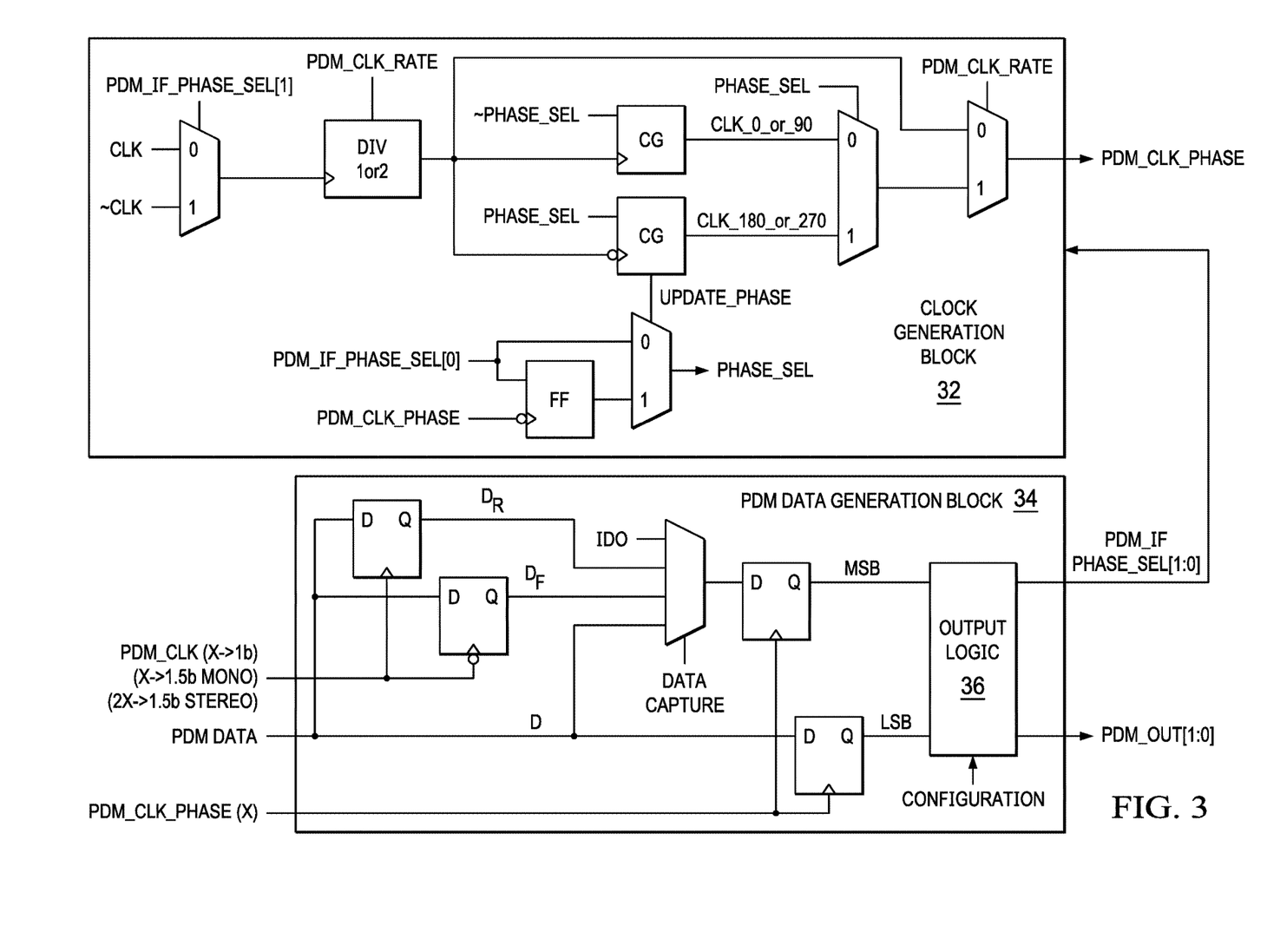
FIG. 3 is a block diagram of selected components of an example processing subsystem of a Class-D amplifier, in accordance with embodiments of the present disclosure.

FIG. 3 is a block diagram of selected components of an example processing subsystem 30 of a Class-D amplifier (e.g., a Class-D amplifier 16), in accordance with embodiments of the present disclosure. As shown in FIG. 3, processing subsystem 30 may include a clock generation block 32 for generating a local clock signal PDM_CLK_PHASE at a phase relative to clock signal CLK received by processing subsystem 30 and a PDM data generation block 34. Key to the operation of processing subsystem 30 is that output logic 36 of PDM data generation block 34 generates a PDM output signal PDM_OUT (which is depicted as a two-bit datagram in FIG. 3 for clarity and exposition, although PDM output signal PDM_OUT may have any suitable bit width), based on a configuration of audio IC 9 (e.g., number of audio channels, bit width, etc.), as well as output a signal PDM_IF_PHASE_SEL that indicates an output of the PDM signal based on the phase of the local clock PDM_CLK_PHASE. Clock generation block 32 may receive the signal PDM_IF_PHASE_SEL, and the logic of clock generation block 32 may, for configurations in which the bit width of input signal PDMDATA is two or more (e.g., for 1.5 bit or higher signal resolution), may detect if an invalid state is detected for the phase of the local clock PDM_CLK_PHASE (which indicates that the local clock is not properly aligned with the data stream), and if so, may correct and update the local clock to properly align with the data stream, thus performing automatic format detection of the incoming PDM data. In some embodiments, such as for 1.5-bit data in which one code of the four binary codes of a datagram is invalid (or any other bit width datagram having at least one invalid code), such invalid state may be determined by the signal PDM_IF_PHASE_SEL having an invalid code. In other embodiments, such as for 2-bit data with no invalid code (or any other bit width datagram having no invalid codes), such invalid state may be determined by the signal PDM_IF_PHASE_SEL having an invalid transition (e.g., an invalid transition for successive datagrams associated with a channel).

Figure 4:
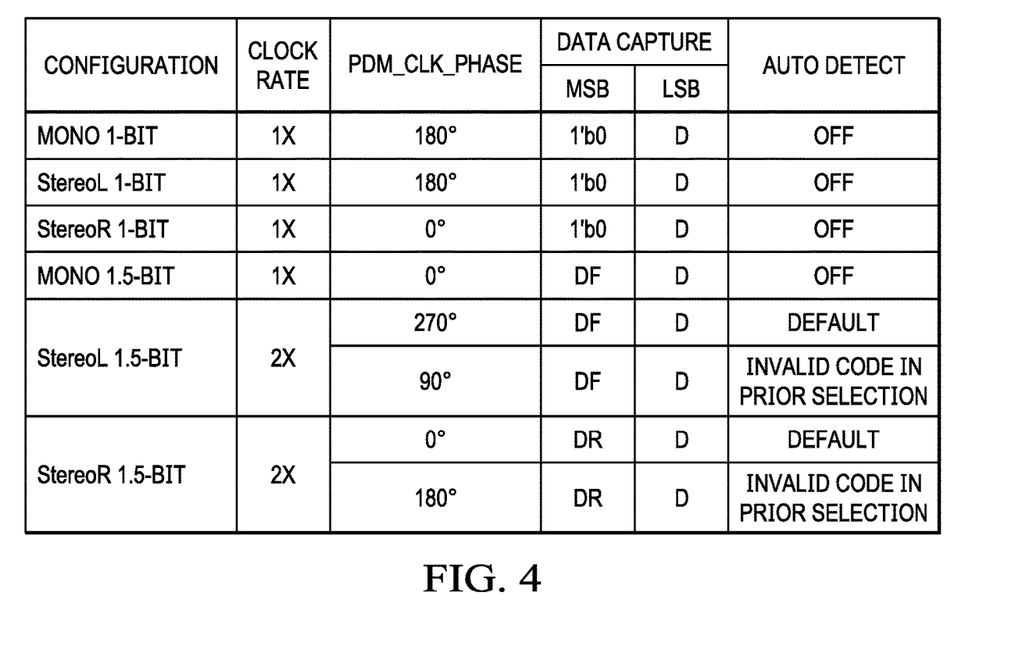
FIG. 4 illustrates a table showing various parameters that may be applied by a processing system based on a configuration of an audio integrated circuit in accordance with embodiments of the present disclosure.
Figure 5:
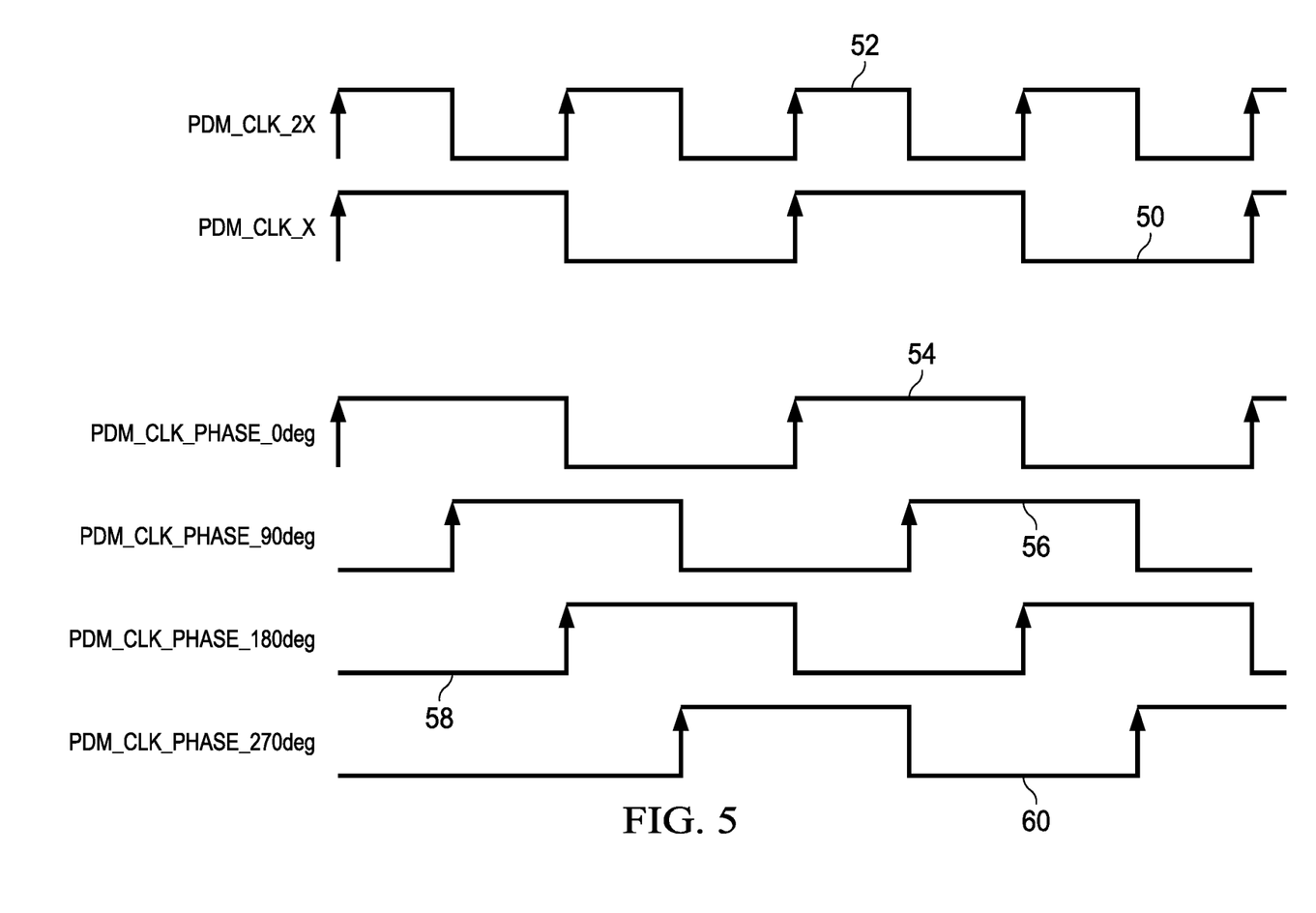
FIG. 5 illustrates example clock waveforms that may be generated by a processing subsystem, in accordance with embodiments of the present disclosure.

To further illustrate the operation of example processing subsystem 30, reference is made to FIGS. 4 and 5. FIG. 4 illustrates a table showing various parameters that may be applied by processing subsystem 30 based on a configuration of audio IC 9, in accordance with embodiments of the present disclosure. FIG. 5 illustrates example clock waveforms that may be generated by processing subsystem 30, in accordance with embodiments of the present disclosure.

As shown in FIG. 4, if audio IC 9 is operated in a single-channel (mono) configuration with PDM datagrams of a single bit, processing subsystem 30 may generate a clock signal having a waveform of a particular frequency (denoted by "1×" under clock rate in FIG. 4, and represented by waveform 50 in FIG. 5), and with a local clock PDM_CLK_PHASE being delayed 180 degrees from clock signal CLK (represented by waveform 58 of FIG. 5). In such configuration, Class-D amplifier 16 and PDM generator 14 should not be misaligned, and thus automatic format detection may be disabled, as indicated by the word "OFF" in the "AUTO DETECT" column in FIG. 4. Thus, in such a configuration, local clock PDM_CLK_PHASE may be adjusted to an active edge of clock signal CLK, and generated with a 180-degree phase shift with respect to clock signal CLK.

If audio IC 9 is operated in a dual-channel (stereo) configuration with PDM datagrams of a single bit, processing subsystem 30 of a first channel (e.g., the left channel, indicated by the row "STEREOL 1-BIT" in FIG. 4) may generate a clock signal having a waveform of the same frequency applied for the single-bit, single-channel configuration (denoted by "1×" under clock rate in FIG. 4, and represented by waveform 50 in FIG. 5), and with a local clock PDM_CLK_PHASE being delayed 180 degrees from clock signal CLK (represented by waveform 58 of FIG. 5). Likewise, processing subsystem 30 of a second channel (e.g., the right channel, indicated by the row "STEREOR 1-BIT" in FIG. 4) may generate a clock signal having a waveform of the same frequency applied for the single-bit, single-channel configuration (denoted by "1×" under clock rate in FIG. 4, and represented by waveform 50 in FIG. 5), and with a local clock PDM_CLK_PHASE having no delay from clock signal CLK (represented by waveform 54 of FIG. 5). In such configuration, Class-D amplifier 16 and PDM generator 14 should not be misaligned, and thus automatic format detection may be disabled, as indicated by the word "OFF" in the "AUTO DETECT" column in FIG. 4 for the rows labeled "STEREOL 1-BIT" and "STEREOR 1-BIT" in FIG. 4. Thus, in such a configuration, local clock PDM_CLK_PHASE of the first channel may be adjusted to an active edge of clock signal CLK, and generated with a 180-degree phase shift with respect to clock signal CLK, while local clock PDM_CLK_PHASE of the first channel may be adjusted to an active edge of clock signal CLK, and generated with no phase shift with respect to clock signal CLK.

As shown in FIG. 4, if audio IC 9 is operated in a single-channel (mono) configuration with PDM datagrams of 1.5 bits (e.g., two-bit datagrams representing three quantization levels and one invalid two-bit code), processing subsystem 30 may generate a clock signal having a waveform of the same frequency applied for the single-bit, single-channel configuration (denoted by "1×" under clock rate in FIG. 4, and represented by waveform 50 in FIG. 5), and with a local clock PDM_CLK_PHASE having no delay from clock signal CLK (represented by waveform 54 of FIG. 5). In such configuration, Class-D amplifier 16 and PDM generator 14 should not be misaligned, and thus automatic format detection may be disabled, as indicated by the word "OFF" in the "AUTO DETECT" column in FIG. 4. Thus, in such a configuration, local clock PDM_CLK_PHASE may be adjusted to the least-significant bit of input signal PDM_DATA. If the most-significant bit is sent on the negative edge of clock signal CLK and the least-significant bit on the positive edge of clock signal CLK, then local clock PDM_CLK_PHASE should have no phase shift with respect to clock signal CLK.

As shown in FIG. 4, if audio IC 9 is operated in a dual-channel (stereo) configuration with PDM datagrams of 1.5 bits (e.g., two-bit datagrams representing three quantization levels and one invalid two-bit code), processing subsystem 30 of a first channel (e.g., the left channel, indicated by the row "STEREOL 1.5-BIT" in FIG. 4) may generate a clock signal having a waveform of twice the frequency applied for the single-bit, single-channel configuration (denoted by "2×" under clock rate in FIG. 4, and represented by waveform 52 in FIG. 5), and by default may generate a local clock PDM_CLK_PHASE being delayed 270 degrees from clock signal CLK (represented by waveform 60 of FIG. 5). However, for the dual-channel, 1.5-bit configuration, in the event that operation with the local clock PDM_CLK_PHASE being delayed 270 degrees from clock signal CLK results in an invalid code being generated by output logic 36, processing subsystem 30 of the first channel may modify the local clock to be delayed 90 degrees from clock signal CLK (represented by waveform 56 of FIG. 5). Similarly, processing subsystem 30 of a second channel (e.g., the right channel, indicated by the row "STEREOR 1.5-BIT" in FIG. 4) may generate a clock signal having a waveform of twice the frequency applied for the single-bit, single-channel configuration (denoted by "2×" under clock rate in FIG. 4, and represented by waveform 52 in FIG. 5), and by default may generate a local clock PDM_CLK_PHASE having no delay from clock signal CLK (represented by waveform 54 of FIG. 5). However, for the dual-channel, 1.5-bit configuration, in the event that opera-tion with the local clock PDM_CLK_PHASE having no delay from clock signal CLK results in an invalid code being generated by output logic 36, processing subsystem 30 of the second channel may modify the local clock to be delayed 180 degrees from clock signal CLK (represented by waveform 58 of FIG. 5). Accordingly, because PDM generator 14 and Class-D amplifiers 16 may be powered on asynchronously in the dual-channel, 1.5-bit configuration, processing subsystems 30 may determine boundaries of each encoded datagram of the data stream of signal PDM_DATA based on where within the stream the invalid code occurred. Also of note is that in each case, the local clocks PDM_CLK_PHASE of the two channels are 180 degrees out of phase, meaning that encoded datagrams for one channel are sampled on a rising edge of a clock, and encoded datagrams for another channel are sampled on a falling edge of the same clock.

Figure 6:
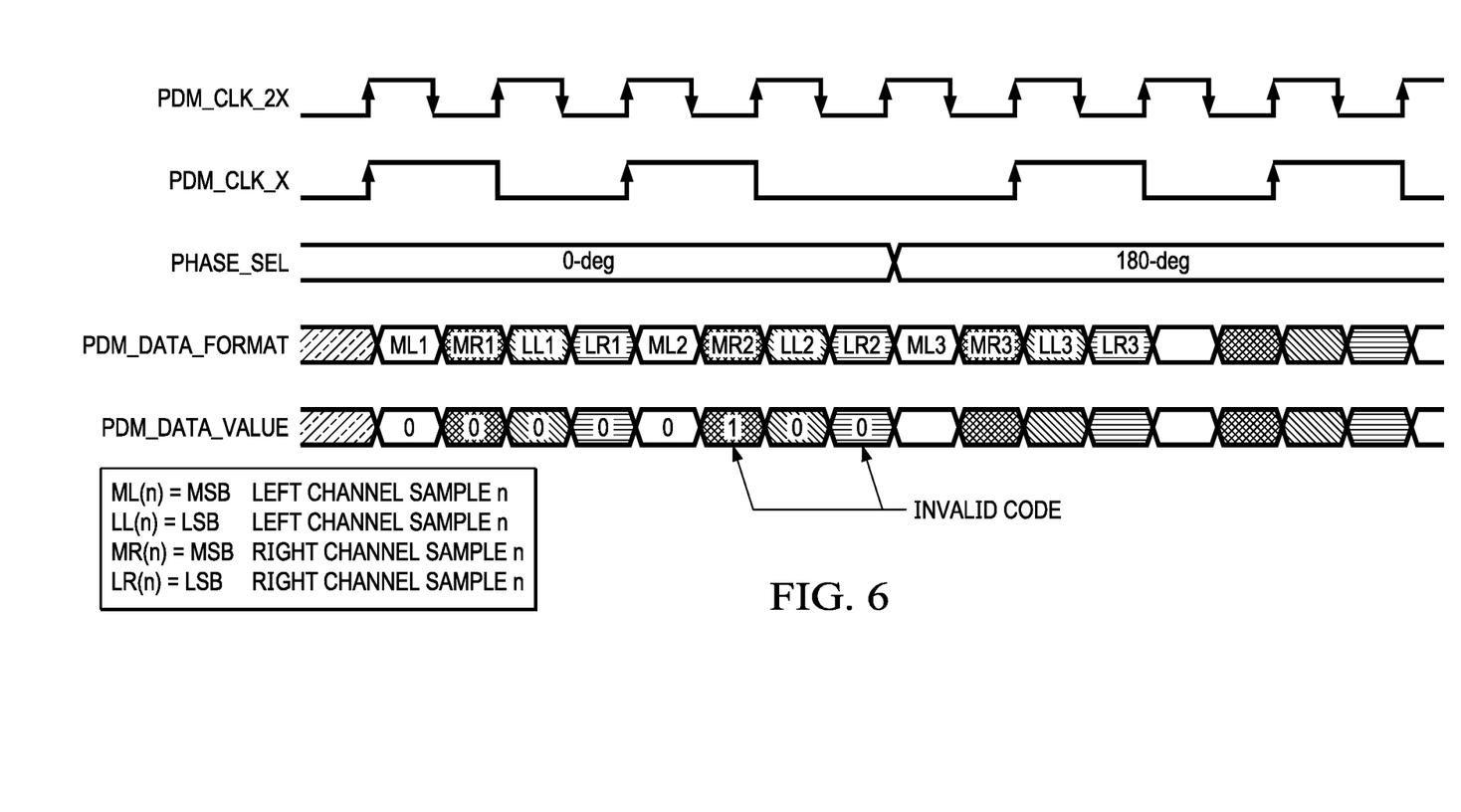
FIG. 6 illustrates example clock and signal waveforms that may be generated by a processing subsystem, in accordance with embodiments of the present disclosure.

This, in the dual-channel, 1.5-bit configuration, local clock PDM_CLK_PHASE for each channel may be set to a default phase. Processing subsystem 30 of each channel may search for an invalid code, and detection of an invalid code may indicate the default setting for phase was incorrect, and then local clock PDM_CLK_PHASE for each channel may be modified to align the clock to capture data at the earliest time possible. For example, consider a scenario in a dual-channel, 1.5-bit configuration in which the code "10" is invalid for a datagram. In such a scenario, a processing subsystem 30 may search for two consecutive bits having the value "10." If "10" occurs respectively at a least-significant bit of one datagram and the most-significant bit of the subsequent datagram, such detection may indicate a correct setting for the default clock phase. However, if "10" occurs respectively at a most-significant bit of one datagram and the least-significant bit of the same datagram, such detection may indicate an incorrect setting for the default clock phase, and processing subsystem 30 may respond by modifying the phase of its local clock PDM_CLK_PHASE. FIG. 6 illustrates example clock and signal waveforms that may be generated by processing subsystem 30, in accordance with embodiments of the present disclosure, and illustrates an example detection of invalid code "10" occurring the a most-significant bit and a least-significant bit of a right-channel datagram. As a result of the detection of the invalid code, processing subsystem 30 of the right channel may modify the local clock to be delayed 180 degrees from clock signal CLK (represented by waveform 58 of FIG. 5) and may insert an appropriate delay into clock signal PDM_CLK_X as shown in FIG. 6.

For purposes of clarity and exposition, example processing subsystem 30 of FIG. 3 (and FIGS. 4-6 further illustrating its operation) is one which can handle various configurations of the data stream of signal PDM_DATA, including one-channel or dual-channel configurations, and configurations in which the data stream of signal PDM_DATA comprises single-bit datagrams or dual-bit datagrams representing three quantization levels. However, it is understood that example processing subsystem 30 of FIG. 3 could be additionally modified in accordance with this disclosure to apply to data streams of any bit width which have at least one invalid code (e.g., the number of quantization levels represented by a datagram is less than $2^N$, wherein N=the number of bits in the datagram). In addition, it is understood that example processing subsystem 30 of FIG. 3 could be additionally modified in accordance with this disclosure to apply to data streams of any bit width in which datagrams have no invalid codes (e.g., the number of quantization levels represented by a datagram equals $2^N$, wherein N=the number of bits in the datagram). For example, in data streams in which datagrams have no invalid codes, processing subsystem 30 may detect for the occurrence of an invalid transition between one or more bits of successive datagrams for a particular channel.

In addition, example processing subsystem 30 of FIG. 3 could be additionally modified in accordance with this disclosure to apply to systems having more than two channels of audio data.

Thus, in accordance with the foregoing, this disclosure may disclose a method (and system for performing the method) comprising receiving a stream of serial PDM data representing a first channel of data synchronized with a rising edge of a clock associated with the serial PDM data and a second channel of data synchronized with a falling edge of the clock, wherein each of the first channel of data and the second channel of data include encoded datagrams wherein each encoded datagram comprises more than one digital bit. The method may further include, detecting an invalid state associated with the stream. The method may also include responsive to detecting the invalid state, determining boundaries of each encoded datagram of the stream based on where within the stream the invalid state occurred. The method may additionally include, responsive to detecting the invalid state, modifying the clock to align with the boundaries of each encoded datagram. In some embodiments, modifying the clock to align with the boundaries of each encoded datagram may comprise modifying the clock such that a PDM output delay for a PDM interface circuit configured to receive the stream is approximately zero.

In these and other embodiments of the method, the number of quantization levels represented by an encoded datagram may be equal to a power of two of the number of bits in the encoded datagram and detecting the invalid state comprises detecting an invalid transition between successive datagrams of one of the first channel and the second channel. In these and other embodiments of the method, the number of quantization levels represented by an encoded datagram is less than a power of two of the number of bits in the encoded datagram and detecting the invalid state comprises detecting an invalid datagram in one of the first channel and the second channel.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method comprising:
   receiving a stream of serial pulse-density modulation (PDM) data representing a first channel of data synchronized with a rising edge of a clock associated with the serial PDM data and a second channel of data synchronized with a falling edge of the clock, wherein each of the first channel of data and the second channel of data include encoded datagrams wherein each encoded datagram comprises more than one digital bit;
   detecting an invalid state associated with the stream; and
   responsive to detecting the invalid state, determining boundaries of each encoded datagram of the stream based on where within the stream the invalid state occurred.

2. The method of claim 1, wherein:
   a number of quantization levels represented by an encoded datagram is equal to a power of two of a number of bits in the encoded datagram; and
   detecting the invalid state comprises detecting an invalid transition between successive datagrams of one of the first channel and the second channel.

3. The method of claim 1, wherein:
   a number of quantization levels represented by an encoded datagram is less than a power of two of a number of bits in the encoded datagram; and detecting the invalid state comprises detecting an invalid datagram in one of the first channel and the second channel.

4. The method of claim 1, further comprising, responsive to detecting the invalid state, modifying the clock to align with the boundaries of each encoded datagram.

5. The method of claim 4, wherein modifying the clock to align with the boundaries of each encoded datagram comprises modifying the clock such that a PDM output delay for a PDM interface circuit configured to receive the stream is approximately zero.

6. A system comprising:
- an input configured to receive a stream of serial pulse-density modulation (PDM) data representing a first channel of data synchronized with a rising edge of a clock associated with the serial PDM data and a second channel of data synchronized with a falling edge of the clock, wherein each of the first channel of data and the second channel of data include encoded datagrams wherein each encoded datagram comprises more than one digital bit; and
- a processing subsystem configured to:
  - detect an invalid state associated with the stream; and
  - responsive to detecting the invalid state, determine boundaries of each encoded datagram of the stream based on where within the stream the invalid state occurred.

7. The system of claim 6, wherein:
- a number of quantization levels represented by an encoded datagram is equal to a power of two of a number of bits in the encoded datagram; and
- detecting the invalid state comprises detecting an invalid transition between successive datagrams of one of the first channel and the second channel.

8. The system of claim 6, wherein:
- a number of quantization levels represented by an encoded datagram is less than a power of two of a number of bits in the encoded datagram; and
- detecting the invalid state comprises detecting an invalid datagram in one of the first channel and the second channel.

9. The system of claim 6, wherein the processing subsystem is further configured to, responsive to detecting the invalid state, modify the clock to align with the boundaries of each encoded datagram.

10. The system of claim 9, wherein modifying the clock to align with the boundaries of each encoded datagram comprises modifying the clock such that a PDM output delay for a PDM interface circuit configured to receive the stream is approximately zero.

* * * * *